United States Patent
van Aalst

(10) Patent No.: US 9,021,691 B2
(45) Date of Patent: May 5, 2015

(54) METHOD FOR INTRODUCING ELECTRICAL INSULATIONS IN PRINTED CIRCUIT BOARDS

(75) Inventor: Jan van Aalst, Barsinghausen (DE)

(73) Assignee: LPKF Laser & Electronics AG, Garbsen (DE)

(*) Notice: Subject to any disclaimer, the term of this patent is extended or adjusted under 35 U.S.C. 154(b) by 239 days.

(21) Appl. No.: 13/695,888

(22) PCT Filed: Mar. 23, 2011

(86) PCT No.: PCT/DE2011/075048
§ 371 (c)(1),
(2), (4) Date: Nov. 2, 2012

(87) PCT Pub. No.: WO2011/137897
PCT Pub. Date: Nov. 10, 2011

(65) Prior Publication Data
US 2013/0055566 A1    Mar. 7, 2013

(30) Foreign Application Priority Data
May 4, 2010  (DE) .................. 10 2010 019 407

(51) Int. Cl.
*H05K 3/02*      (2006.01)
(52) U.S. Cl.
CPC ........ *H05K 3/027* (2013.01); *H05K 2203/0746* (2013.01); *H05K 2203/107* (2013.01)
(58) Field of Classification Search
CPC ............ H05K 3/027; H05K 2203/107; H05K 2203/0746

USPC ........... 29/830–831, 846–847, 825; 430/311, 430/313–315; 174/255, 260–264
See application file for complete search history.

(56) References Cited

U.S. PATENT DOCUMENTS

| | | | |
|---|---|---|---|
| 3,587,067 A * | 6/1971 | Enz .................................. | 365/58 |
| 4,228,514 A | 10/1980 | Weiss | |
| 5,079,825 A * | 1/1992 | Matsui et al. ................... | 29/520 |
| 5,338,645 A * | 8/1994 | Henderson et al. ........... | 430/311 |
| 5,441,474 A | 8/1995 | Morofuji | |
| 5,451,722 A * | 9/1995 | Gregoire ....................... | 174/261 |
| 5,462,512 A | 10/1995 | Hiroshima et al. | |
| 5,494,781 A * | 2/1996 | Ohtani et al. ................. | 430/313 |
| 5,525,205 A | 6/1996 | Miyashita | |

(Continued)

FOREIGN PATENT DOCUMENTS

| | | |
|---|---|---|
| DE | 3245272 A1 | 6/1984 |
| DE | 4416962 A1 | 2/1995 |

(Continued)

OTHER PUBLICATIONS

European Patent Office, International Search Report in International Patent Application No. PCT/DE2011/075048 (Oct. 31, 2011).

*Primary Examiner* — Minh Trinh
(74) *Attorney, Agent, or Firm* — Leydig, Voit & Mayer, Ltd.

(57) ABSTRACT

A method for introducing electrical insulations in a printed circuit board includes selectively introducing groove-shaped recesses between different regions of an electrically conductive layer on a substrate along a machining path using a thermal energy input such that end portions of each of the recesses or different ones of the recesses are joined to one another. The end portions are introduced parallel to one another without overlap such that a strip-shaped region of the conductive layer is initially retained between the end portions so as to insulate the different regions.

7 Claims, 1 Drawing Sheet

(56) References Cited

U.S. PATENT DOCUMENTS

| | | |
|---|---|---|
| 5,670,067 A | 9/1997 | Koide et al. |
| 5,759,416 A | 6/1998 | Bosman |
| 6,161,055 A | 12/2000 | Pryor |
| 6,662,439 B1 | 12/2003 | Bhullar |
| 7,559,152 B2 | 7/2009 | Wenke et al. |
| 2001/0006766 A1 | 7/2001 | O'Brien et al. |
| 2003/0047280 A1 | 3/2003 | Takayama et al. |
| 2012/0273261 A1* | 11/2012 | Yi et al. .................. 174/255 |

FOREIGN PATENT DOCUMENTS

| | | |
|---|---|---|
| DE | 4429522 A1 | 3/1995 |
| DE | 69411337 T2 | 2/1999 |
| DE | 102005008878 A1 | 8/2006 |
| DE | 102004006414 B4 | 8/2008 |
| EP | 0834191 A1 | 4/1998 |
| JP | 1073090 A | 3/1989 |
| JP | 4116887 A | 4/1992 |
| JP | 4208591 A | 7/1992 |
| JP | 5021933 A | 1/1993 |
| JP | 5160549 A | 6/1993 |
| JP | 10328974 A | 12/1998 |
| JP | 2003047841 A | 2/2003 |
| WO | 2009117979 A1 | 10/2009 |

* cited by examiner

METHOD FOR INTRODUCING ELECTRICAL INSULATIONS IN PRINTED CIRCUIT BOARDS

CROSS-REFERENCE TO PRIOR APPLICATIONS

This application is a U.S. National Phase application under 35 U.S.C. §371 of International Application No. PCT/DE2011/075048, filed on Mar. 23, 2011, and claims benefit to German Patent Application No. DE 10 2010 019 407.7, filed on May 4, 2010. The International Application was published in German on Nov. 10, 2011 as WO 2011/137897 under PCT Article 21(2).

FIELD

The invention relates to a method for introducing electrical insulations in different regions of a printed circuit board by introducing a recess between said regions of an electrically conductive layer on a substrate, wherein the groove-shaped recess is introduced selectively in the conductive layer along a machining path by means of thermal energy input, and the end portions of one recess or different recesses are joined to one another.

BACKGROUND

Methods for introducing electrical insulations in different regions of a printed circuit board, which are known as scribing methods, for producing electrically insulated conductor tracks, for example in the production of printed circuit boards, are already known from DE 10 2004 006 414 B4, in which for the partial removal of defined regions, these regions are heated selectively by laser radiation in order to reduce the adhesion, and are then removed as a whole. In order to confine the heating to the defined regions, a thermal insulation is initially produced by the laser beam around the perimeter of these regions by using the laser beam to introduce a linear recess.

DE 44 29 522 A1 already teaches a method for introducing electrical insulations in a printed circuit board by introducing a recess between different regions of an electrically conductive layer on a substrate, wherein the groove-shaped recess is introduced selectively in the conductive layer along a machining path by means of thermal energy input from a laser beam. In this case, the end portions of the same recess or different recesses are joined to one another, said end portions of one recess or different recesses being introduced in overlapping parallel lines in order to insulate different regions.

DE 32 45 272 A1 relates to a method for producing miniaturised track geometries arranged on a substrate and lying at least in one plane. In this case, the burn marks produced by a programmed laser in the layer introduced of conductive material and covering the full surface of a substrate are controlled so as to produce inductance.

U.S. Pat. No. 5,525,205 A already describes a method for partial detachment of a defined region of a conductive layer, in particular a copper layer, by means of a laser beam, in which the laser-beam parameters are set such that only the conductive layer is removed, without an underlying substrate that supports the conductive layer also being affected at the same time, wherein said region is insulated from the adjoining regions of the conductive layer by removing the conductive layer in the outer edge region of said region. The enclosed region of the conductive layer is then removed by chemical etching.

U.S. Pat. No. 6,662,439 B1 already discloses a method for laser ablation of a metallic layer from a flexible substrate material in the continuous feed process. The substrate material is a polymer, for example polyester, which supports a thin metallic layer, for example introduced of gold, which is selectively removed by an Excimer laser.

In addition, U.S. Pat. No. 5,759,416 A relates to a method for laser ablation of a thin metallic layer from a non-metallic substrate material. The metallic layer is gold, for example. A focused laser beam travelling along a pre-programmed path is used for the ablation of the metallic layer.

A method for laser removal of conductive layers by reducing the adhesion between conductive layer and substrate is known from EP 0 834 191 B1. Similar methods are also known from US 2003/0047280 A1 and JP 2003047841 A.

SUMMARY

In an embodiment, the present invention provides a method for introducing electrical insulations in a printed circuit board. Groove-shaped recesses are selectively introduced between different regions of an electrically conductive layer on a substrate along a machining path using a thermal energy input such that end portions of each of the recesses or different ones of the recesses are joined to one another. The end portions are introduced parallel to one another without overlap such that a strip-shaped region of the conductive layer is initially retained between the end portions so as to insulate the different regions.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
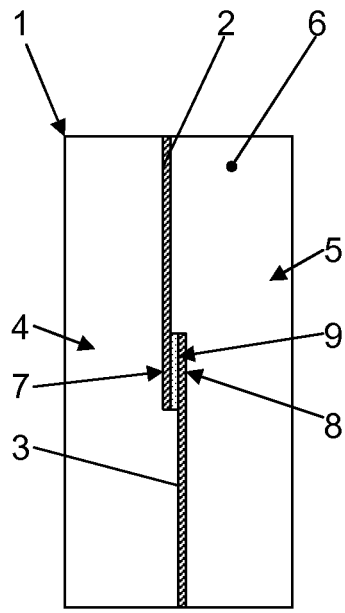
FIG. 1 shows two recesses introduced by the method according to an embodiment of the invention and having parallel end portions spaced apart from one another.

A problem with the method that arises in practice is the control of the recesses in the respective end portions thereof, which overlap or are tangential to one another at the start points and endpoints of same. In particular, it is crucially important here for reliable electrical insulation that the conductive layer is also removed in the end portions of the recess in order to avoid a short circuit. Thus the recesses ideally meet directly but without any substantial overlap with one another.

If the recesses overlap one another, the laser beam does not hit the conductive layer but, because of the layer already removed earlier, hits the substrate directly as the substrate material, which can be damaged thereby. In addition, the repeated energy input causes widening of the recess, with the result that impairment of adjacent conductor tracks cannot be ruled out. Consequently, an optimum work result is only produced by introducing the recesses such that in the end portions they have substantially no overlap and adjoin one another directly. The problem here, however, is that these requirements theoretically demand zero tolerance from the controller, which cannot be met in practice.

One idea is be to permit an overlapping region of the end regions of the recesses, but to simultaneously reduce the thermal energy input in this overlapping region in order to avoid potential damage to the substrate. This approach does not produce the desired outcome, however, because with any existing small deviation of the desired position from the actual position of the end portion, the reduced energy input in this zone is no longer sufficient to guarantee the required electrical insulation. Were there the intention to try to control the thermal energy input according to the previously detected overlapping region, this would involve considerable additional effort, which would result in a delay in production.

In an embodiment, the invention provides a means for ensuring that the desired reliable electrical insulation of the different regions is achieved by introducing the recess even for those machining situations in which, when introducing the recesses, deviations from the respective desired position arise in the end portions of said recesses.

According to an embodiment of the invention, a method is thus provided in which, in order to insulate the different regions, the end portions to be joined of one recess or different recesses are introduced parallel to one another without overlap such that a strip-shaped region of the conductive layer is initially retained between these end portions of the recesses. The invention, in an embodiment, is based on the surprising finding that reliable insulation is ensured when the path of the same recess or different recesses runs in parallel in the end portions, specifically by the fact that an electrical bridge creating a short-circuit is removed even when the actual position deviates from the desired position. The invention, in an embodiment, exploits here the physical effect that, given a parallel, spaced-apart path of the end portions, when there is a deviation, a strip-shaped region of the conductive layer is initially retained between these end portions of the recess. Heat that is input while introducing the recesses in the adjoining end portions of the conductive layer is faced, however, with the substantially reduced heat dissipation, or capability for conducting heat away, of the enclosed, largely thermally insulated region, and therefore the heat that is input can only be conducted away via the end faces of the strip-shaped region. Consequently, this indirect heat input is already sufficient to ensure reliable detachment of the strip-shaped region, and therefore neither an overlap of the recesses is necessary for electrical insulation nor a position of the end portions of the recess in which said end portions directly adjoin one another. The control program can hence be selected according to an embodiment of the invention such that coincidence of the end positions when introducing the recesses is not set as the desired position, but a parallel path of said recesses at a small separation, where the separation is selected so that possible tolerance factors do not affect the reliable detachment of the strip-shaped region.

The end portions could already be achieved by extending the recesses running along parallel straight lines so that the end portions run parallel and adjacent to one another. On the other hand, a modification in which the end portions are introduced as a curve or a bend of the recesses is particularly promising. This substantially reduces the space required for the parallel path while also achieving a parallel path of the end portions that does not depend on the path and the particular orientation of the recesses. For example, an in particular right-angled bend can be provided for this purpose, or a spiral path, which permits a relatively large length of the parallel-running end portions within a relatively small surface region.

In a further modification of the method, which is also particularly promising and in which the end portions run at least in portions along parallel straight lines and enclose between them a strip-shaped region of the layer, said region having a constant width, it is possible to rule out an overlap of the end portions as a result of known tolerances in implementing the method while also ensuring that the strip-shaped region of the conductive layer is detached as a result of the indirect energy input, for example also by means of an additional fluid flow.

It is particularly advantageous here if the recesses to be joined are introduced along parallel machining paths, and the end portions are introduced substantially at right-angles to the machining paths. This achieves particularly reliable insulation by means of the recesses while also ruling out any overlap of an end portion with other portions of the same recess.

In addition, it is particularly advantageous in practice if the length of each end portion is defined according to the parameters of the electrically conducting layer or according to the thermal energy input. The length of the end portion is thereby limited to a size that is appropriate to the particular case, thereby introducing it possible to avoid, in particular, unnecessary process operations and additional use of space, which is undesirable.

In principle, when introducing the end portions of the recesses, an increasing width can be provided by expansion of the laser beam in order to produce thereby in sub-portions an overlap or touching of the different end portions, in particular also in conjunction with a reduced power density in these sub-portions. On the other hand, an embodiment of the method is particularly simple in which each end portion has a constant width along its main dimension, so that the method can be implemented quickly and reliably without a complex control circuit.

By introducing an additional weakening or recess in the conductive layer in a region between the end portions, in particular parallel to said end portions along the geometric center between the end portions, the appropriate insulations can be introduced reliably even when deviations are relatively large.

The method is not restricted solely to electrical insulations. In fact, it also proves practical to use the recesses between the regions for thermal or mechanical separation and/or insulation of these regions, and, for example, to assist the surface-wide detachment of the regions enclosed in this way.

Figure 2:
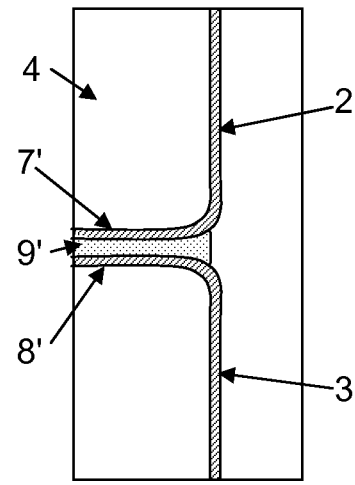
FIG. 2 shows a variant of the recesses having bent end portions.
Figure 3:
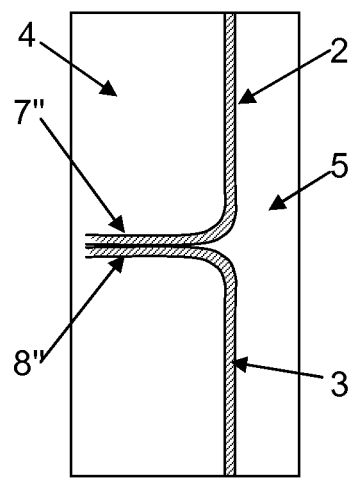
FIG. 3 shows a variant of the recesses in which the end portions adjoin one another directly.
Figure 4:
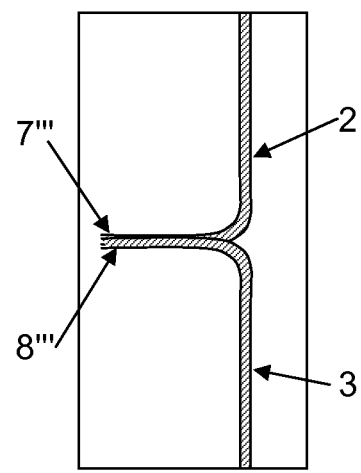
FIG. 4 shows a variant of the recesses, in which the end portions overlap one another.

The method according to an embodiment of the invention is presented in greater detail below with reference to FIGS. 1 to 4. By means of the method, electrical insulations are introduced in a printed circuit board 1 by introducing separate recesses 2, 3 between different regions 4, 5 of an electrically conductive layer 6 on a substrate, which is not shown in further detail. For this purpose, the recesses 2, 3 are introduced along a machining path by means of a laser beam as groove-shaped recesses in the conductive layer 6. In order to guarantee here the electrical insulation between the regions 4, 5 without the end faces having to touch, the end portions 7, 8 of the recesses 2, 3 run along parallel straight lines and enclose between them a strip-shaped region 9 of constant width. As a result of the heat input when introducing the end portions 7, 8, the adhesion forces of the strip-shaped region 9 are reduced such that this region self-detaches from the substrate or can be removed without difficulty using a jet of compressed air. Thus direct laser radiation aimed at this strip-shaped region 9 is not required, and therefore an additional process operation is not necessary. In order to ensure reliable detachment of the strip-shaped region 9, therefore, neither an overlap of the recesses 2, 3 is necessary for electrical insulation nor a position of the end portions 7, 8 of the recesses 2, 3 in which said end portions directly adjoin one another. FIG. 1 shows the end portions 7, 8 being introduced as an adjacent path of parallel recesses 2, 3. In contrast, the end portions 7', 8' shown in FIG. 2 are each introduced as bends in the recesses 2, 3, which then reliably enclose a strip-shaped region 9', which extends into the region 4, even when the main dimension axes of the recesses 2, 3 have an unintended offset. The rest of the printed circuit board pattern, which is not shown, is a decisive factor here in the choice of the particular shape of the end portions 7, 7', 8, 8'. Any deviations that may occur in practice are considered in the cases shown in FIGS. 3 and 4, where in FIG. 3 a path of the end portions 7'', 8'' in which they run immediately adjacent to one another is implemented, resulting in optimum insulation of the regions 4, 5. In the case shown in FIG. 4, on the other hand, the end portions 7''', 8''' overlap and hence the laser beam acts on the substrate, resulting in a widening of the recesses 2, 3. Owing to the bend, however, this affected region is displaced into an region that is not critical to the operation of the printed circuit board, so that, depending on the form of the printed circuit board pattern, this results in an advantage even over the variant shown in FIG. 1.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B." Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise.

The invention claimed is:

1. A method for introducing electrical insulations in a printed circuit board, the method comprising:
   selectively introducing groove-shaped recesses between different regions of an electrically conductive layer on a substrate along a machining path using a thermal energy input such that end portions of each of the recesses or different ones of the recesses are joined to one another;
   wherein the end portions are introduced parallel to one another without overlap such that a strip-shaped region of the conductive layer is initially retained between the end portions so as to insulate the different regions, the strip-shape region self-detaching from the substrate when there is a reduction of adhesion forces of the strip-shaped region that results from heat input when introducing the end portions, and
   wherein at least one of an additional weakening and an additional recess is introduced in the conductive layer on the substrate in a geometric center region between the end portions.

2. The method according to claim 1, wherein the end portions are introduced as a curve or a bend of the recesses.

3. The method according to claim 1, wherein the recesses to be joined are introduced along parallel machining paths and the end portions are introduced substantially at right angles to the machining paths.

4. The method according to claim 1, wherein the end portions extend at least in portions along parallel straight lines and delimit therebetween the strip-shaped region with a constant width.

5. The method according to claim 1, further comprising removing the strip-shaped region delimited between the end portions using a fluid flow.

6. The method according to claim 1, wherein each of the end portions, along a main extension, has a constant width.

7. The method according to claim 1, wherein the thermal energy input is provided by a laser beam.

* * * * *